United States Patent
Ishino et al.

(10) Patent No.: US 12,334,338 B2
(45) Date of Patent: *Jun. 17, 2025

(54) METHOD OF MANUFACTURING SEMICONDUCTOR DEVICE

(71) Applicant: Kioxia Corporation, Minato-ku (JP)

(72) Inventors: Takaya Ishino, Yokkaichi (JP); Atsushi Takahashi, Yokkaichi (JP); Kazunori Zaima, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 241 days.

This patent is subject to a terminal disclaimer.

(21) Appl. No.: 17/879,108

(22) Filed: Aug. 2, 2022

(65) Prior Publication Data

US 2022/0384180 A1 Dec. 1, 2022

Related U.S. Application Data

(63) Continuation of application No. 16/059,222, filed on Aug. 9, 2018, now Pat. No. 11,437,232.

(30) Foreign Application Priority Data

Dec. 20, 2017 (JP) ................. 2017-244253

(51) Int. Cl.
*H01L 21/02* (2006.01)
*H01L 21/027* (2006.01)
(Continued)

(52) U.S. Cl.
CPC .... *H01L 21/0234* (2013.01); *H01L 21/02115* (2013.01); *H01L 21/0271* (2013.01);
(Continued)

(58) Field of Classification Search
CPC .......... H01L 21/0234; H01L 21/02115; H01L 21/0271; H01L 21/31116; H01L 21/31144;
(Continued)

(56) References Cited

U.S. PATENT DOCUMENTS 7,473,377 B2 * 1/2009 Yamaguchi ....... H01L 21/31144
257/E21.252
8,946,809 B2 * 2/2015 Takamura ......... H01L 29/66833
365/185.14
(Continued)

FOREIGN PATENT DOCUMENTS

JP 6-275581 9/1994
JP 06275581 A * 9/1994
(Continued)

*Primary Examiner* — Mounir S Amer
*Assistant Examiner* — Alexander Belousov
(74) *Attorney, Agent, or Firm* — Oblon, McClelland, Maier & Neustadt, L.L.P.

(57) ABSTRACT

In one embodiment, a method of manufacturing a semiconductor device includes forming a first film on a substrate. The method further includes performing a first process of forming a concave portion in the first film and forming a second film on a surface of the first film that is exposed in the concave portion by using a first gas containing a carbon element and a fluorine element. The method further includes performing a second process of exposing the second film to a second gas containing a hydrogen element or a fluid generated from the second gas.

19 Claims, 3 Drawing Sheets

(51) Int. Cl.
  *H01L 21/311* (2006.01)
  *H10B 43/27* (2023.01)
  *H10B 43/35* (2023.01)
  *H10B 43/50* (2023.01)

(52) U.S. Cl.
  CPC .. *H01L 21/31116* (2013.01); *H01L 21/31144* (2013.01); *H10B 43/27* (2023.02); *H10B 43/35* (2023.02); *H10B 43/50* (2023.02)

(58) Field of Classification Search
  CPC ..... H01L 27/1158; H10B 43/50; H10B 43/35; H10B 43/27
  See application file for complete search history.

(56) References Cited

U.S. PATENT DOCUMENTS

| | | | | |
|---|---|---|---|---|
| 9,412,617 | B2* | 8/2016 | Narishige | H01J 37/32091 |
| 9,613,824 | B2* | 4/2017 | Saitoh | H10B 43/50 |
| 9,620,366 | B2* | 4/2017 | Nakao | H01L 21/0338 |
| 9,627,401 | B2* | 4/2017 | Tsuda | H01L 21/31111 |
| 9,754,793 | B2* | 9/2017 | Nakao | H01L 21/31144 |
| 9,779,961 | B2* | 10/2017 | Saitoh | H01L 21/3085 |
| 11,437,232 | B2* | 9/2022 | Ishino | H01L 21/0234 |
| 2006/0003577 | A1* | 1/2006 | Sone | H01L 21/76802 |
| | | | | 438/638 |
| 2006/0261516 | A1* | 11/2006 | Kunitake | H01L 21/02183 |
| | | | | 257/E21.29 |
| 2014/0030638 | A1* | 1/2014 | Choi | G03F 1/28 |
| | | | | 430/5 |
| 2014/0206198 | A1* | 7/2014 | Tahara | H01L 21/3065 |
| | | | | 438/715 |
| 2014/0273487 | A1* | 9/2014 | Deshmukh | H01L 21/6875 |
| | | | | 156/345.43 |
| 2016/0071957 | A1* | 3/2016 | Oshiki | H01L 21/32137 |
| | | | | 438/703 |
| 2016/0079264 | A1* | 3/2016 | Inaba | H10B 43/27 |
| | | | | 257/314 |
| 2016/0126252 | A1* | 5/2016 | Tsuda | H01L 29/7926 |
| 2016/0293609 | A1* | 10/2016 | Jha | H01L 21/31116 |
| 2016/0336191 | A1* | 11/2016 | Saitoh | H10B 43/50 |
| 2016/0365249 | A1* | 12/2016 | Nakao | H01L 21/0337 |
| 2017/0162596 | A1* | 6/2017 | Tsuda | H01L 29/66833 |
| 2019/0043732 | A1* | 2/2019 | Eason | H10B 43/27 |
| 2019/0189423 | A1* | 6/2019 | Ishino | H01L 21/31144 |
| 2022/0384180 | A1* | 12/2022 | Ishino | H10B 43/35 |

FOREIGN PATENT DOCUMENTS

| | | |
|---|---|---|
| JP | 2006-19480 | 1/2006 |
| JP | 2014-17406 | 1/2014 |
| JP | 2014-187191 | 10/2014 |
| JP | 2016-51750 | 4/2016 |
| JP | 2016-58456 | 4/2016 |
| JP | 2016-62898 | 4/2016 |
| JP | 2016-92044 | 5/2016 |
| JP | 2016-197719 | 11/2016 |
| JP | 2016-219771 | 12/2016 |
| JP | 2017-5178 | 1/2017 |
| WO | WO 2004/003988 A1 | 1/2004 |

* cited by examiner

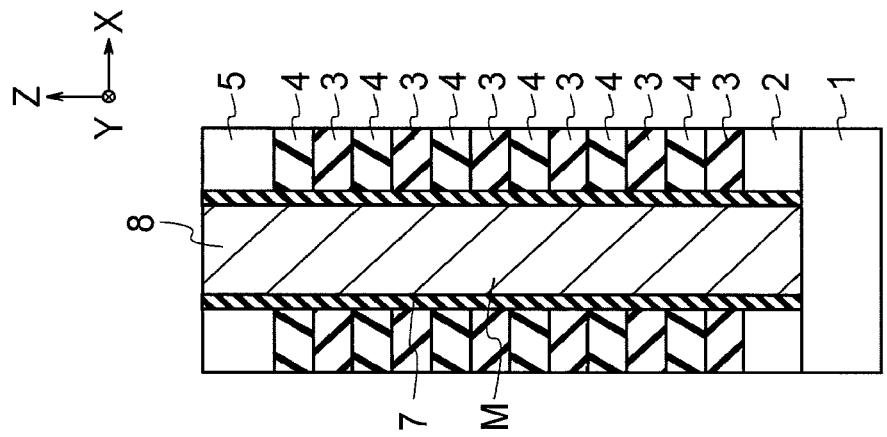
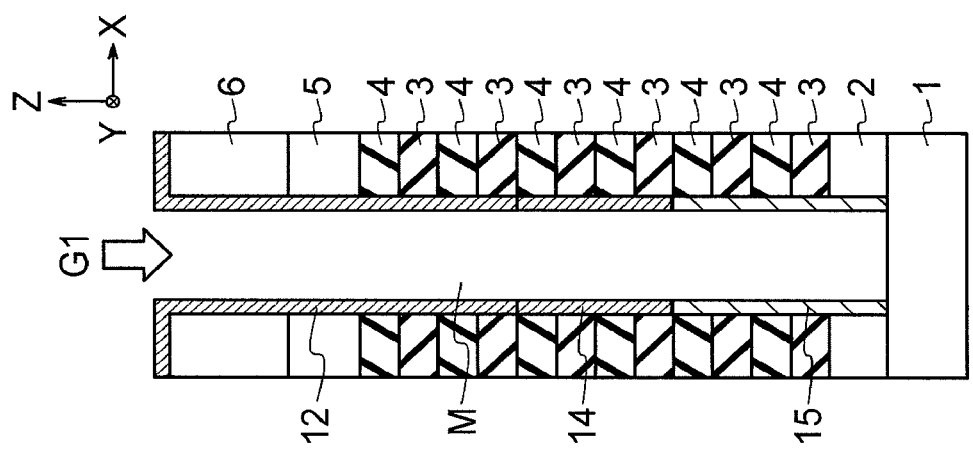
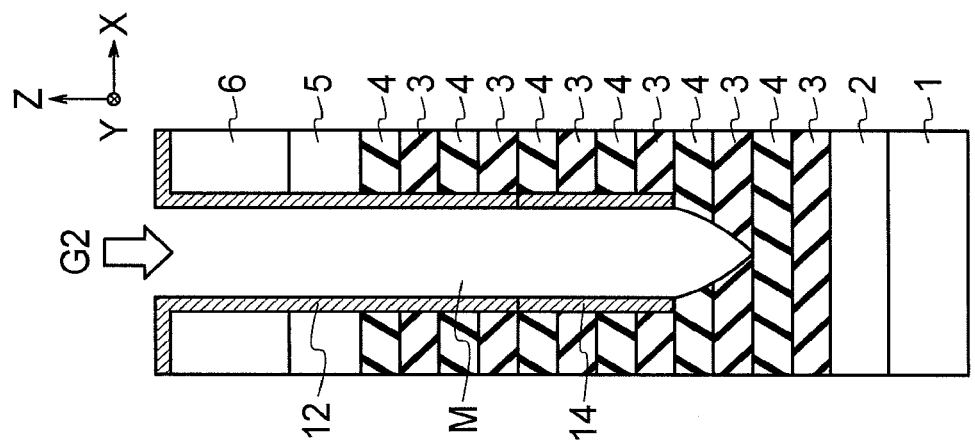

METHOD OF MANUFACTURING SEMICONDUCTOR DEVICE

CROSS REFERENCE TO RELATED APPLICATION

This application is a continuation of and claims the benefit of priority under 35 U.S.C. § 120 from U.S. application Ser. No. 16/059,222 filed Aug. 9, 2018, and claims the benefit of priority under 35 U.S.C. § 119 from Japanese Patent Application No. 2017-244253 filed Dec. 20, 2017, the entire contents of each of which are incorporated herein by reference.

FIELD

Embodiments described herein relate to a method of manufacturing a semiconductor device.

BACKGROUND

Recently, a three-dimensional semiconductor memory or the like has been manufactured by processing a hole with a high aspect ratio in many cases. In these cases, there arises a problem that the shape of the hole bows (i.e., becomes a bowing shape) while the processing time increases. Therefore, it is considered to form a sidewall protection film on the side face of the hole when processing the hole. However, when the quality or the amount of the sidewall protection film is problematic, the sidewall protection film cannot sufficiently protect the side face of the hole. The same holds true also for a case of processing a concave portion (e.g., trench) other than the hole.

BRIEF DESCRIPTION OF THE DRAWINGS

FIGS. 1A to 2C are cross-sectional views showing a method of manufacturing a semiconductor device of a first embodiment.

DETAILED DESCRIPTION

Embodiments will now be explained with reference to the accompanying drawings.

In one embodiment, a method of manufacturing a semiconductor device includes forming a first film on a substrate. The method further includes performing a first process of forming a concave portion in the first film and forming a second film on a surface of the first film that is exposed in the concave portion by using a first gas containing a carbon element and a fluorine element. The method further includes performing a second process of exposing the second film to a second gas containing a hydrogen element or a fluid generated from the second gas.

First Embodiment

FIGS. 1A to 2C are cross-sectional views showing a method of manufacturing a semiconductor device of a first embodiment. The semiconductor device of the present embodiment is a three-dimensional semiconductor memory.

Figure 1A:
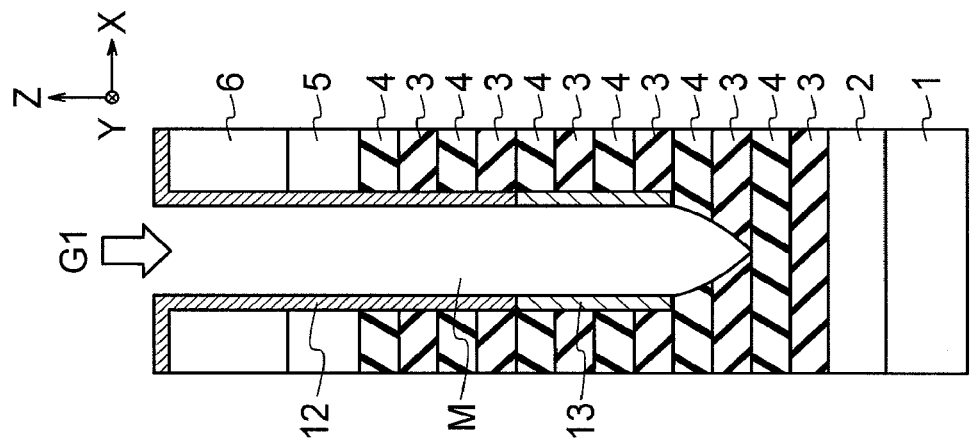

First, as shown in FIG. 1A, a lower layer 2 is formed on a substrate 1. Next, a stacked film alternately including a plurality of first insulating layers 3 and a plurality of second insulating layers 4 is formed on the lower layer 2. This stacked film is an example of a first film. Next, an upper layer 5 is formed on the stacked film. Next, a hard mask layer 6 is formed on the upper layer 5.

An example of the substrate 1 is a semiconductor substrate such as a silicon (Si) substrate. FIG. 1A shows an X-direction and a Y-direction which are parallel to the surface of the substrate 1 and perpendicular to each other, and a Z-direction perpendicular to the surface of the substrate 1. In the specification, the +Z-direction is regarded as the upward direction, and the −Z-direction is regarded as the downward direction. The −Z-direction may coincide with the direction of gravity or may not coincide with the direction of gravity.

An example of the lower layer 2 is an insulator such as a silicon oxide film ($SiO_2$) or a silicon nitride film (SiN), or a conducting layer formed between insulators. An example of the first insulating layer 3 is a silicon nitride film. An example of the second insulating layer 4 is a silicon oxide film. An example of the upper layer 5 is an insulator such as a silicon oxide film or a silicon nitride film, or a conducting layer formed between insulators. An example of the hard mask layer 6 is an organic hard mask layer.

Next, as shown in FIG. 1A, an opening pattern for forming a memory hole M is formed in the hard mask layer 6 by lithography and etching. Next, using the hard mask layer 6, a first process of etching the first insulating layers 3, the second insulating layers 4 and the upper layer 5 is performed. As a result, the memory hole M is formed in the first insulating layers 3, the second insulating layer 4 and the upper layer 5 in the middle thereof. The memory hole M is an example of a concave portion.

The first process is performed using a first gas G1 containing a carbon element and a fluorine element. The first gas G1 of the present embodiment contains $C_xH_yF_z$ gas. Note that C denotes a carbon element, H denotes a hydrogen element, F denotes a fluorine element, x is an integer of one or more, y is an integer of zero or more, and z is an integer of one or more ($x \geq 1$, $y \geq 0$ and $z \geq 1$). When $y=0$, $C_xH_yF_z$ is a fluorocarbon, and when $y \neq 0$, $C_xH_yF_z$ is a hydrofluorocarbon. Examples of the $C_xH_yF_z$ gas include $C_4F_6$ gas, $C_4F_8$ gas, $CH_2F_2$ gas and the like.

In the first process, etching with $C_xH_yF_z$ plasma is performed, and a sidewall film 11 is formed on the surfaces and the like of the first insulating layers 3, the second insulating layers 4 and the upper layer 5 that are exposed in the memory hole M (FIG. 1A). The sidewall film 11 of the present embodiment is a fluorocarbon film containing a carbon element and a fluorine element. The sidewall film 11 is an example of a second film.

Figure 1B:
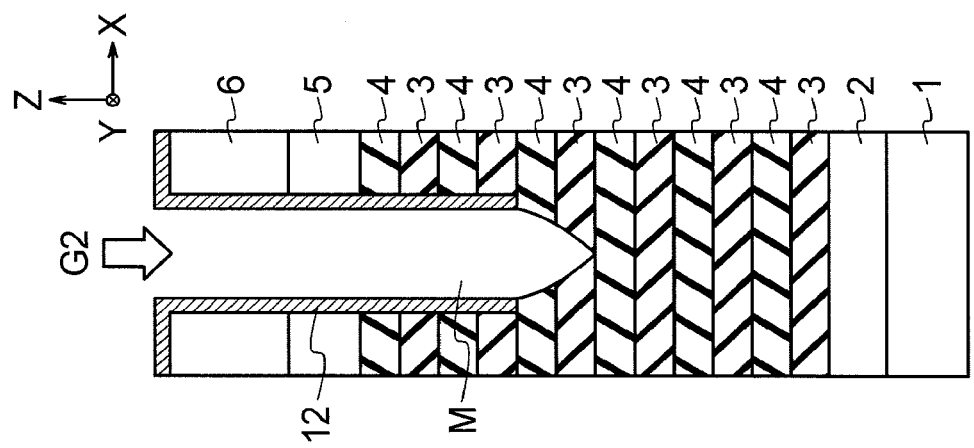

Next, a second process of reforming the sidewall film 11 is performed (FIG. 1B). FIG. 1B shows a reformed sidewall film 12 obtained by reforming the sidewall film 11.

The second process is performed using a second gas G2 containing a hydrogen element. The second gas G2 of the present embodiment contains $H_2S$ (hydrogen sulfide) gas. Note that S denotes a sulfur element. In the second process, the sidewall film 11 is reformed by the sidewall film 11 exposed to the $H_2S$ gas or a fluid generated from the $H_2S$ gas (for example, exposed to $H_2S$ plasma).

Hereafter, the reformation of the sidewall film 11 is described in detail.

As mentioned above, the sidewall film 11 of the present embodiment is a fluorocarbon film containing a carbon element and a fluorine element. Although the sidewall film 11 functions as a protection film in etching, for example, when high energy ions are incident on the sidewall film 11, there can be a case where the sidewall film 11 contributes the etching. In other words, it is concerned that the sidewall film 11 promotes etching of the inside of the memory hole M. The reason is that the sidewall film 11 contributes to be a supply source of $CF_a$ in the following chemical equation (1).

$$SiO_2 + CF_a \rightarrow SiF_b\uparrow + CO_c\uparrow \quad (1)$$

where a, b and c represent composition ratios.

According to equation (1), when the quantity of fluorine atoms in the sidewall film 11 is reduced, the supply amount of $CF_a$ can be reduced, which can suppress the etching of the inside of the memory hole M. Therefore, in the second process, the sidewall film 11 is reformed. Specifically, fluorine in the sidewall film 11 is caused to react with hydrogen in the second gas to be eliminated as hydrogen fluoride. Thereby, the carbon-richer reformed sidewall film 12 than the sidewall film 11 can be obtained, which can reduce a fluorine concentration in the reformed sidewall film 12 than a fluorine concentration in the sidewall film 11. Accordingly, for example, even when high energy ions are incident on the reformed sidewall film 12, the reaction in chemical equation (1) hardly occurs, which suppresses etching of the inside of the memory hole M.

Therefore, according to the present embodiment, the sidewall film 11 can be suppressed from contributing etching, and the reformed sidewall film 12 can be caused to function as a protection film. Thereby, the shape of the memory hole M can be suppressed from bowing.

The second gas G2 may contain only $H_2S$ gas, or may contain $H_2S$ gas and other gas. In the latter case, it is desirable that the flow rate (or pressure) of the $H_2S$ gas be set to occupy 80% or more of the flow rate (or pressure) of the second gas G2. Thereby, the sidewall film 11 can be sufficiently reformed with the second gas G2.

In addition to $H_2S$ gas, the second gas G2 may contain He (helium) gas, which has a low atomic weight, a low sputtering rate, and poor chemical reactivity. In this case, it is desirable that the sum total of the flow rate (or pressure) of the $H_2S$ gas and the flow rate (or pressure) of the He gas be set to occupy 80% or more of the flow rate (or pressure) of the second gas G2. The second gas G2 in this case may contain only $H_2S$ gas and He gas, or further contain other gas.

In the present embodiment, the first process and the second process are alternately performed after that, and thereby, the memory hole M is completed. In other words, the memory hole M of the present embodiment is formed by alternately feeding the first gas G1 and the second gas G2. In the present embodiment, a plurality of first processes and a plurality of second processes are alternately performed in the same reaction chamber. Hereafter, details of these processes are described.

Figure 1C:
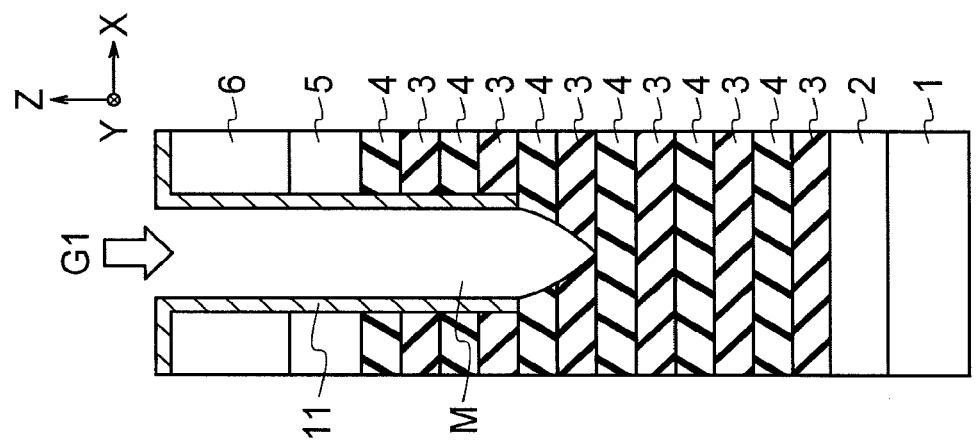

After the second process, the first process of etching the first insulating layers 3 and the second insulating layers 4 using the first gas G1 is performed again (FIG. 1C). As a result, the process of forming the memory hole M progresses to lower the bottom face of the memory hole M. In this first process, etching with $C_xH_yF_z$ plasma is performed, and a sidewall film 13 is formed on the surfaces of the first insulating layers 3 and the second insulating layers 4 that are exposed in the memory hole M. The sidewall film 13 has a similar property to that of the aforementioned sidewall film 11, and is formed below the reformed sidewall film 12. The sidewall film 13 is also an example of the second film.

Next, the second process of reforming the sidewall film 13 using the second gas G2 is performed again (FIG. 2A). FIG. 2A shows a reformed sidewall film 14 obtained by reforming the sidewall film 13. In this second process, the sidewall film 13 is reformed by the sidewall film 13 exposed to $H_2S$ plasma. The reformed sidewall film 14 has a similar property to that of the aforementioned reformed sidewall film 12.

Next, the first process of etching the first insulating layers 3 and the second insulating layers 4 using the first gas G1 is performed again (FIG. 2B). As a result, the process of forming the memory hole M progresses to lower the bottom face of the memory hole M. In this first process, etching with $C_xH_yF_z$ plasma is performed, and a sidewall film 15 is formed on the surfaces of the first insulating layers 3 and the second insulating layers 4 that are exposed in the memory hole M. The sidewall film 15 has a similar property to that of the aforementioned sidewall films 11 and 13, and is formed below the reformed sidewall film 14. In FIG. 2B, the bottom face of the memory hole M reaches the substrate 1, and the memory hole M is completed. When the memory hole M is not completed in FIG. 2B, the second process is performed again after that.

Next, after removing the reformed sidewall films 12 and 14 and the sidewall film 15, a memory insulator 7 and a channel semiconductor layer 8 are sequentially formed in the memory hole M (FIG. 2C). As mentioned later, the memory insulator 7 is formed by sequentially forming a first insulator (block insulator), a charge storage layer and a second insulator (tunnel insulator) in the memory hole M.

As above, the semiconductor device of the present embodiment is manufactured.

Hereafter, details of the steps in FIGS. 1A to 2C are described.

In addition to $H_2S$ gas, the second gas G2 may contain $SF_6$ (sulfur hexafluoride) gas. Thereby, the shape of the memory hole M can be more effectively suppressed from bowing. It is desirable that the flow rate (or pressure) of the $SF_6$ gas be set to occupy less than 20% of the flow rate (or pressure) of the second gas G2. The second gas G2 in this case may contain only $H_2S$ gas and $SF_6$ gas, or may further contain other gas (for example, He gas).

The action of $H_2S$ gas and $SF_6$ gas is understood as follows. When $H_2S/SF_6$ plasma is caused to impact on a fluorocarbon film which is the sidewall films 11 and 13, F in the fluorocarbon film is abstracted by H. Thereby, the C-content in the fluorocarbon film increases, and C—C bonds in the fluorocarbon film increase. In this stage, S in the $H_2S/SF_6$ plasma is incorporated into the fluorocarbon film also to form C—S—C bonds. Since C—C bonds and C—S bonds are more stable in energy than C—F bonds and C—H bonds, the fluorocarbon film becomes stronger. As a result, by the sidewall films 11 and 13 changing to the reformed sidewall films 12 and 14, etching resistance increases, which can suppress the diameter of the memory hole from widening during the processing of the memory hole M.

Due to such an action, the aforementioned first and second processes can also be applied to processing of films other than a stacked film of the first and second insulating layers 3 and 4. For example, the aforementioned first and second processes can also be applied to a case of forming a contact hole in an interlayer dielectric, and a case of forming a memory hole in a stacked film including a plurality of electrode layers (for example, polysilicon layers) and a plurality of insulating layers (for example, silicon oxide films). Furthermore, the aforementioned first and second processes can also be applied to a case of forming a shallow trench in the substrate 1 or in a layer on the substrate 1. Moreover, the hard mask layer 6 may be a carbon-containing film such as a carbon layer or a metal-containing layer such as a tungsten layer.

Plasma conditions for the $H_2S/SF_6$ plasma can be arbitrarily set.

In the present embodiment, each first process is performed for 5 or more seconds, and each second process is also performed for 5 or more seconds. Note that the performing time of the second process is sufficient to be secured to some extent, and hence, each second process of the present embodiment is performed for 5 or more seconds and less than 100 seconds. In the present embodiment, approximately 2 times to 20 times of first processes and approximately 2 times to 20 times of second processes are performed.

As to the stacked film of the first and second insulating layers 3 and 4, the first insulating layers 3 (silicon nitride films) are replaced by electrode layers in a replacing step performed after the steps in FIGS. 1A to 2C. In the replacing step, hollows are formed between the second insulating layers 4 and the like by removing the first insulating layers 3, and the electrode layers are embedded in the hollows. An example of the electrode layers is described with FIG. 3.

Figure 3:
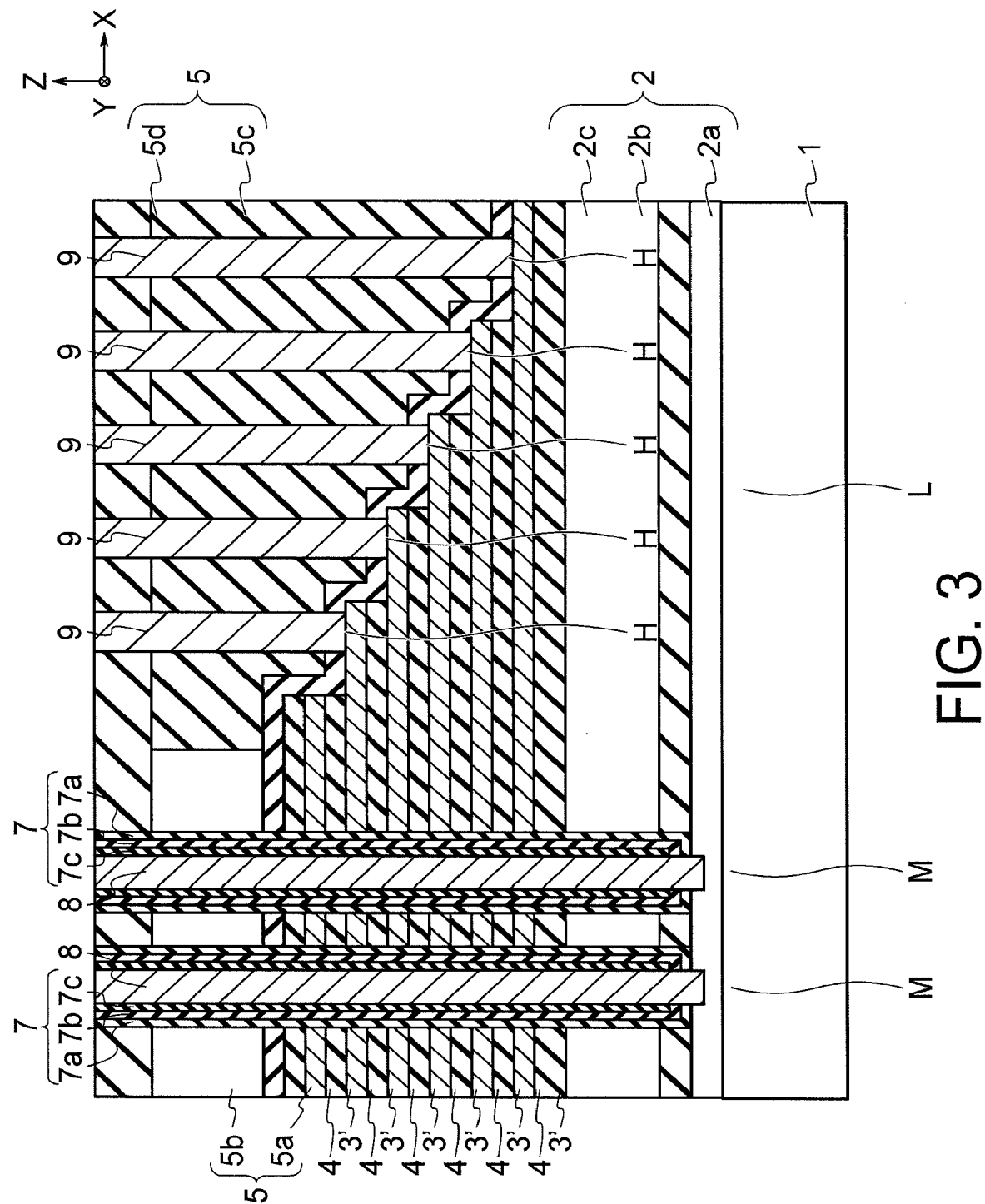
FIG. 3 is a cross-sectional view showing a structure of a semiconductor device of the first embodiment.

FIG. 3 is a cross-sectional view showing a structure of the semiconductor device of the first embodiment.

FIG. 3 exemplarily shows a semiconductor device manufactured by the method of the present embodiment. FIG. 3 shows a memory cell part and a step contact part of a three-dimensional semiconductor memory. In FIG. 3, the lower layer 2 is configured of a lower insulator 2a, a source-side conducting layer 2b and an upper insulator 2c, and the upper layer 5 is configured of a protecting insulator 5a, a drain-side conducting layer 5b, a first interlayer dielectric 5c and a second interlayer dielectric 5d. The first insulating layers 3 are replaced by electrode layers 3' including tungsten layers and the like. The stacked film alternately including the plurality of electrode layers 3' and the plurality of second insulating layers 4 is an example of a third film.

FIG. 3 further shows a first insulator 7a, a charge storage layer 7b and a second insulator 7c which constitute the memory insulator 7. The memory insulator 7 and the channel semiconductor layer 8 are formed, for example, by sequentially forming the first insulator 7a, the charge storage layer 7b and the second insulator 7c on the surface of the memory hole M, removing the first insulator 7a, the charge storage layer 7b and the second insulator 7c from the bottom part of the memory hole M, and after that, embedding the channel semiconductor layer 8 in the memory hole M. The channel semiconductor layer 8 is electrically connected to a diffusion layer L in the substrate 1. The memory insulator 7 and the channel semiconductor layer 8 are an example of a fourth film. An insulator called a core material may be further embedded in the memory hole M. The memory hole M of the present embodiment has a shape, for example, shown in FIG. 2C.

FIG. 3 further shows contact plugs 9 formed in contact holes H of the upper layer 5. Each contact plug 9 is formed so as to be electrically connected to the corresponding electrode layer 3'.

As above, the memory hole M of the present embodiment is formed by alternately performing a plurality of first processes using the first gas G1 containing the carbon element and the fluorine element and a plurality of second processes using the second gas G2 containing the hydrogen element. Therefore, according to the present embodiment, the shape of the memory hole M can be suppressed from bowing, which can appropriately realize the memory hole M with a high aspect ratio.

While in the present embodiment, formation of the memory hole M is exemplarily described, application targets of this process are not limited to the memory hole M. For example, this process can also be applied to formation of trenches for line-and-space, and the like.

The first gas G1 and the second gas G2 may be other than the aforementioned gases. For example, the $H_2S$ gas in the second gas G2 may be replaced by $NH_3$ (ammonia) gas, $H_2O$ (water) gas, $H_2$ (hydrogen) gas or the like. Any of $H_2S$ gas, $NH_3$ gas, $H_2O$ gas and $H_2$ gas contains one or more elements of S, N, O and H, and any of $S_2$ gas, $N_2$ gas, $O_2$ gas and $H_2$ gas has a vapor pressure of 10 Pa or more at 150° C. Therefore, when using $H_2S$ gas, $NH_3$ gas, $H_2O$ gas or $H_2$ gas, simple substance gases such as $S_2$ gas, $N_2$ gas, $O_2$ gas and $H_2$ gas which are generated through elimination of H with plasma hardly block up the memory hole M. Therefore, $H_2S$ gas, $NH_3$ gas, $H_2O$ gas and $H_2$ gas are suitable for their use in the reaction chamber. Likewise, the $H_2S$ gas in the second gas G2 may be replaced by gas which is gas of a compound containing a hydrogen element and any element α and in which the vapor pressure of simple substance gas of the element α is 10 Pa or more at 150° C. Examples of such gas are $PH_3$ gas and HI gas, and the vapor pressures of $P_2$ gas and $I_2$ gas is 10 Pa or more at 150° C. S, N, O and the element α are examples of a first element. Moreover, the He gas in the second gas G2 may be replaced by Ar (argon) gas, Kr (krypton) gas or Xe (xenon) gas. Moreover, the $SF_6$ gas in the second gas G2 may be replaced by COS (carbonyl sulfide) gas. $SF_6$ gas and COS gas are examples of gas containing a sulfur element.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    forming a first film on a substrate; and
    performing a first process of forming a concave portion in the first film and forming a second film on a surface of the first film that is exposed in the concave portion by using a first gas containing a carbon element and a fluorine element;
    performing a second process of exposing the second film to a second gas containing a hydrogen element and no fluorine element or a fluid generated from the second gas, after performing the first process; and
    performing a third process of lowering a bottom face of the concave portion and forming a third film on a surface of the first film that is exposed in the concave portion by using the first gas, after performing the second process,
    wherein a carbon concentration in the second film is increased by performing the second process.

2. The method of claim 1, wherein the first film alternately includes a plurality of first insulating layers and a plurality of second insulating layers, or alternately includes a plurality of electrode layers and a plurality of third insulating layers.

3. The method of claim 1, wherein the second gas contains $H_2S$ gas, $NH_3$ gas, $H_2O$ gas or $H_2$ gas.

4. The method of claim 3, wherein a flow rate or a pressure of the $H_2S$ gas, the $NH_3$ gas, the $H_2O$ gas or the $H_2$ gas occupies 80% or more of a flow rate or a pressure of the second gas.

5. The method of claim 3, wherein the second gas further contains He gas, Ar gas, Kr gas or Xe gas.

6. The method of claim 3, wherein the second gas further contains gas containing a sulfur element.

7. The method of claim 3, wherein the second gas contains COS or $SF_6$ gas.

8. A method of manufacturing a semiconductor device, comprising:
  forming a first film on a substrate; and
  performing a first process of forming a concave portion in the first film and forming a second film on a surface of the first film that is exposed in the concave portion by plasma using a first gas containing a carbon element and a fluorine element; and
  performing a second process of exposing the second film to a second gas without etching the concave portion or a fluid generated from the second gas after performing the first process, the second gas containing a hydrogen element and no fluorocarbon.

9. The method of claim 8, further comprising:
  performing a third process of lowering a bottom face of the concave portion by using the first gas and forming a third film on a surface of the first film that is exposed in the concave portion, after performing the second process.

10. The method of claim 8, wherein the first film alternately includes a plurality of first insulating layers and a plurality of second insulating layers, or alternately includes a plurality of electrode layers and a plurality of third insulating layers.

11. The method of claim 8, wherein the second film contains a carbon element.

12. The method of claim 11, wherein each of the second film further contains a fluorine element.

13. The method of claim 8, wherein the first gas contains $C_xH_yF_z$ gas where x is an integer of one or more, y is an integer of zero or more, and z is an integer of one or more.

14. The method of claim 8, wherein the second gas contains $H_2S$ gas, $NH_3$ gas, $H_2O$ gas or $H_2$ gas.

15. The method of claim 14, wherein a flow rate or a pressure of the $H_2S$ gas, the $NH_3$ gas, the $H_2O$ gas or the $H_2$ gas occupies 80% or more of a flow rate or a pressure of the second gas.

16. The method of claim 14, wherein the second gas further contains He gas, Ar gas, Kr gas or Xe gas.

17. The method of claim 14, wherein the second gas further contains gas containing a sulfur element.

18. The method of claim 17, wherein the second gas contains COS or $SF_6$ gas.

19. The method of claim 8, wherein the second gas consists of $H_2S$ gas, $NH_3$ gas, $H_2O$ gas or $H_2$ gas.

* * * * *